(12) United States Patent
Abe et al.

(10) Patent No.: US 6,641,868 B2
(45) Date of Patent: Nov. 4, 2003

(54) SCREEN PRINTING APPARATUS AND METHOD OF SCREEN PRINTING

(75) Inventors: Seiko Abe, Kurume (JP); Takahiro Fukagawa, Ogori (JP); Akira Maeda, Kasuga (JP); Hirotoshi Sakamoto, Tosu (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/192,649

(22) Filed: Jul. 11, 2002

(65) Prior Publication Data

US 2003/0021897 A1 Jan. 30, 2003

(30) Foreign Application Priority Data

Jul. 12, 2001 (JP) .................................. 2001-211840

(51) Int. Cl.[7] .................................................. B05D 5/00
(52) U.S. Cl. ................................................... 427/282
(58) Field of Search ........................ 427/282; 101/129; 118/213, 504

(56) References Cited

U.S. PATENT DOCUMENTS

| 5,996,487 | A | | 12/1999 | Tomomatsu et al. |
| 6,171,399 | B1 | * | 1/2001 | Kaiser et al. |
| 6,395,335 | B2 | * | 5/2002 | Onishi et al. |

FOREIGN PATENT DOCUMENTS

| EP | 0 086 941 | 2/1982 |
| GB | 2 298 393 | 9/1996 |
| GB | 2 351 259 | 12/2000 |
| GB | 2 360 252 | 9/2001 |
| JP | 2-299847 | 12/1990 |
| JP | 8-323956 | 12/1996 |

* cited by examiner

Primary Examiner—Fred J. Parker
(74) Attorney, Agent, or Firm—McDermott, Will & Emery

(57) ABSTRACT

A screen printing method and apparatus for applying paste into pattern apertures of a mask plate by sliding a filling member provided at a lower end of a squeegee head. The filling member forms an acute angle with an upper surface of the mask plate. Any extra paste on the mask plate is wiped by sliding a wiper provided at a lower end of the squeegee head. The wiper forms an obtuse angle with the upper surface of the mask plate.

11 Claims, 6 Drawing Sheets

SCREEN PRINTING APPARATUS AND METHOD OF SCREEN PRINTING

FIELD OF THE INVENTION

The present invention relates to a screen printing apparatus for printing paste, such as cream solder or conductive paste, onto a substrate, and a method of the screen printing using the same apparatus.

BACKGROUND OF THE INVENTION

In an electronic-parts-mounting process, a screen printing process is employed for printing paste, such as cream solder or conductive paste, onto a substrate. According to the screen printing process, a mask plate having pattern apertures corresponding to the places to be printed is placed over a substrate, and paste is printed onto the substrate through the pattern apertures by using a squeegee method.

According to a conventional squeegee method or apparatus, such as disclosed in U.S. Pat. No. 6,171,399, a so-called closed-type squeegee head which has a receptacle holding solder paste therein is known. According to the closed-type squeegee head, solder paste is not supplied to the mask plate separately from the squeegee head. Instead, solder paste held in the receptacle of the closed-type squeegee head is supplied to be filled in the pattern apertures of the mask plate when the squeegee head moves under the condition that a lower end of the squeegee head keeps a contact with the mask plate.

It is generally required for such a squeegee method or apparatus to fill solder paste in the pattern apertures of the mask plate and to wipe extra solder paste on the mask plate away. According to the conventional squeegee method and apparatus, a wiping characteristic deteriorates if the squeegee (wiper) of the squeegee head has a shape or an attachment angle such that a paste filling characteristic is well satisfied. On the other hand, the paste filling characteristic deteriorates if the squeegee has a shape or an attachment angle such that the wiping characteristic is well satisfied. Therefore, the conventional squeegee method and apparatus do not satisfy both of the paste filling characteristic and the wiping characteristic simultaneously.

SUMMARY OF THE INVENTION

Accordingly, it is an object of the present invention to provide a screen printing apparatus and method capable of satisfying both of the paste filling characteristic and the wiping characteristic simultaneously.

It is another object of the present invention to provide a screen printing apparatus and method capable of improving the paste filling characteristic of a closed-type squeegee head.

According to the first aspect of the present invention, a paste is filled into pattern apertures of a mask plate on a substrate by sliding a filling member provided at a lower end of a squeegee head. The filling member forms an acute angle with an upper surface of the mask plate in a space formed in the squeegee head for accommodating the paste. Any extra paste on the mask plate is wiped away (i.e., of the mask plate) by sliding a wiper provided at a lower end of the squeegee head across the mask plate. The wiper forms an obtuse angle with the upper surface of the mask plate in the space formed in the squeegee head for accommodating the paste.

Accordingly, both the paste filling characteristic and the wiping characteristic are satisfied simultaneously by the present invention.

According to another aspect of the present invention, a first pressure is applied to the paste accommodated in the squeegee head when the squeegee head is in a waiting position. Then, a second pressure smaller than the first pressure is applied to the paste accommodated in said squeegee head while the squeegee head is moving on the mask plate.

Accordingly, the paste filling characteristic of a closed-type squeegee head is improved.

DETAILED DESCRIPTION OF PREFERRED EMBODIMENT

Figure 1:
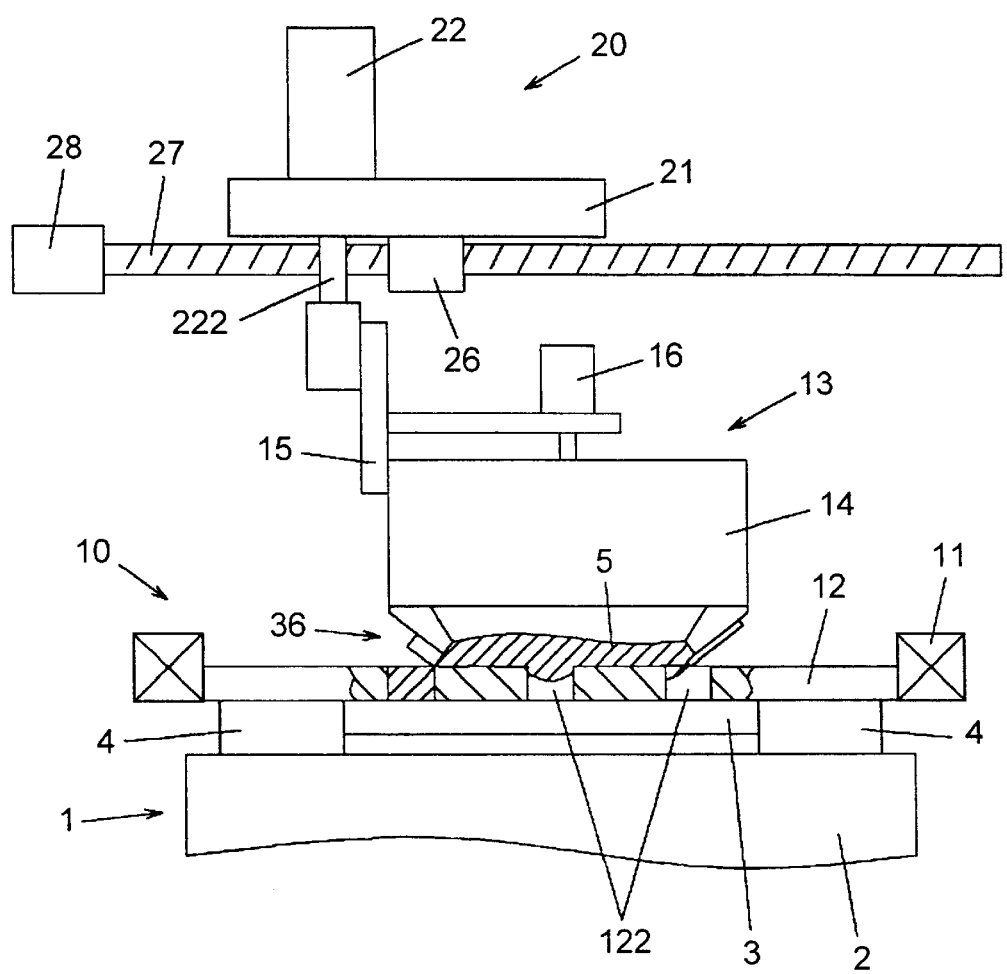
FIG. 1 is a part of a schematic front view of a screen printing apparatus according to an exemplary embodiment of the present invention.
Figure 2:
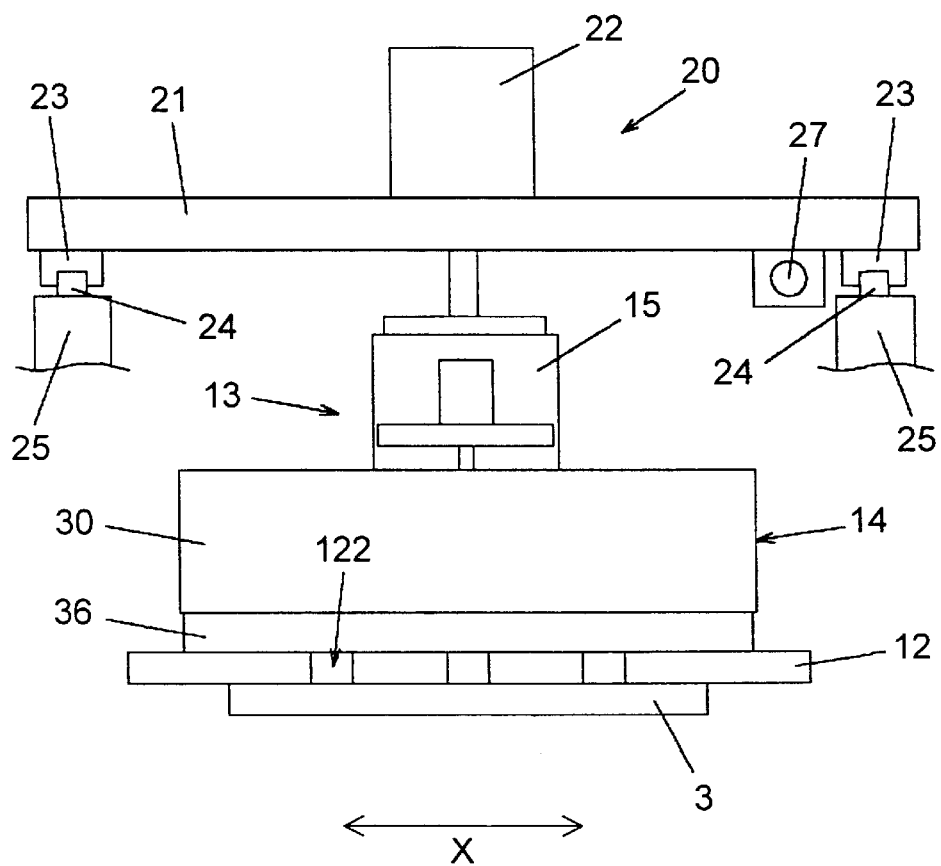
FIG. 2 is a schematic partial side view of the screen printing apparatus according to the exemplary embodiment of the present invention.

Referring to FIGS. 1 and 2, a substrate positioning member 1 comprises a substrate holder 2 provided on a movable table not shown and a clamp 4 connected to the substrate holder 2. A substrate 3 to be printed (i.e., paste applied thereto) is held by the clamp 4 and positioned horizontally and vertically by driving the movable table.

A screen mask 10 comprises a mask plate 12 attached to a holder 11, and is provided above the substrate positioning member 1. The mask plate 12 has pattern apertures 122, which correspond to places for the paste to be printed on the substrate 3, in order to form a printing pattern on the substrate 3.

A squeegee head 13 is located above the screen mask 10 such that the squeegee head 13 is capable of moving up and down by means of a head lift 20. The head lift 20 is equipped with a cylinder 22 vertically provided on a plate 21.

The squeegee head 13 is coupled with a lower end of a rod 222 of the cylinder 22. The squeegee head 13 moves up and down with respect to the mask plate 12 by driving the cylinder 22. The cylinder 22 also works as a presser to push the squeegee head 13 onto the mask plate 12. A pressing force control mechanism disclosed in U.S. Pat. No. 5,996,487 may be applied to the embodiment of the present invention.

A pair of sliders 23 is fixed to both ends of a lower surface of the plate 21. The sliders 23 are loosely fit into guide rails 24 provided on an upper surface of a frame 25 connected to a base (not shown) such that the sliders 23 slide freely with respect to the guide rails 24. A nut 26 is fixed to a lower surface of the plate 21. A motor 28 drives a feed screw 27 which is engaged with the nut 26.

Accordingly, the squeegee head 13 coupled with the head lift 20 and the plate 21 move horizontally by driving the motor 28. The squeegee head 13 moves horizontally on the mask plate 12 keeping in contact with the mask plate 12 when the motor 28 drives under the condition that the squeegee head 13 is down. A printer part 14 for contacting a surface of the mask plate 12 and for filling cream solder 5 into the pattern apertures 122 is provided at a lower portion of the squeegee head 13.

Figure 3:
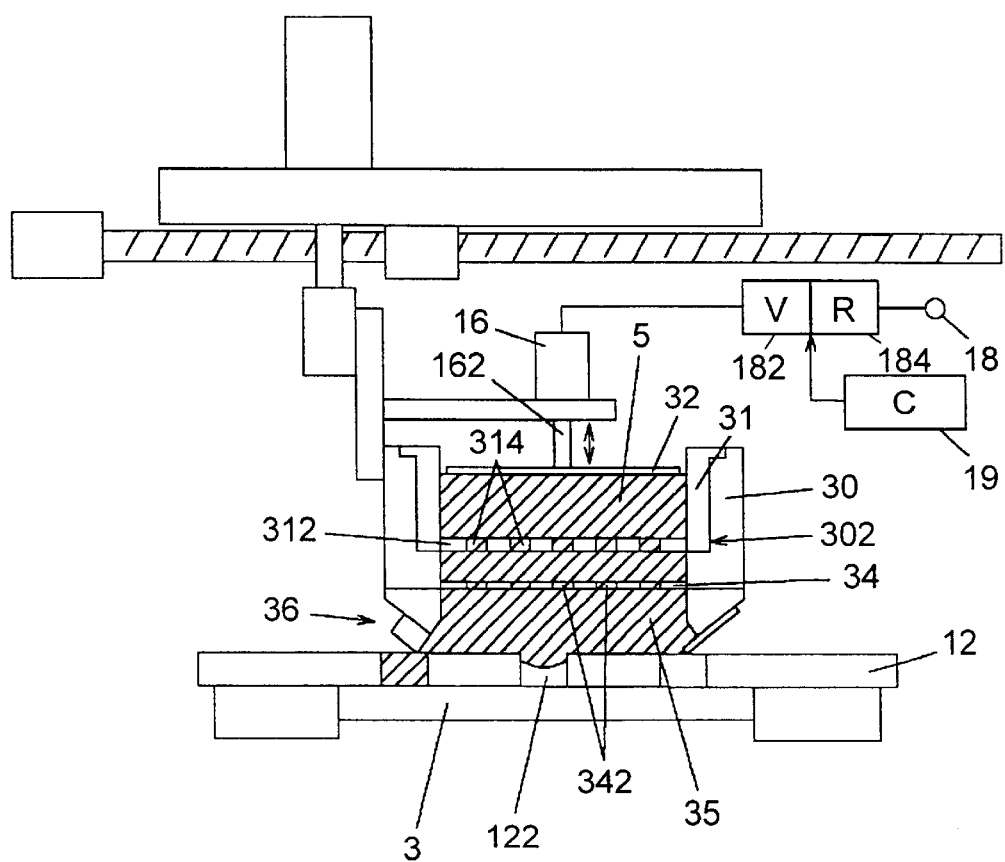
FIG. 3 is a partially sectional schematic front view showing a squeegee head of the screen printing apparatus according to the exemplary embodiment of the present invention.

Referring to FIG. 3, the detailed structure of the printer part 14 will now be described. A main body 30 is a block having a rectangular shape whose longitudinal direction is parallel to the longitudinal direction X shown in FIG. 2 such that the longitudinal length of the main body 30 is greater than the width of the substrate 3 as shown in FIG. 2. The main body 30 has a recess 302 to accommodate a solder cartridge 31 such that the solder cartridge 31 is attachable to and detachable from the main body 30.

The solder cartridge 31 stores a predetermined amount of the paste of the cream solder 5 therein and is attached to the main body 30 before printing. A pressurization plate 32 for pressurizing the cream solder 5 is placed on an upper opening of the cartridge 31.

The pressurization plate 32 is connected to a rod 162 of a cylinder 16 placed above the pressurization plate 32. Accordingly, the pressurization plate 32 is operable to move in the vertical direction within the solder cartridge 31 by driving the cylinder 16.

The cylinder 16 is connected to an air pressure source 18 via a valve 182 and a regulator 184. The regulator 184 is operable to change the pressure of air to be supplied to the cylinder 16 according to a pressure determination signal received from a controller 19 in order to push the cream solder 5 toward the mask plate 12 (downwardly) under a certain pressure.

A bottom portion of the solder cartridge 31 forms an extrusion plate 312 having a plurality of openings 314. When the pressurization plate 32 is lowered by the cylinder 16, the cream solder 5 within the solder cartridge 31 is pushed toward the mask plate 12 and is extruded through the openings 314 of the extrusion plate 312. The pressure to be applied to the cream solder 5 is controlled by the valve 182 and the regulator 184 which are controlled by the controller 19.

A throttle plate 34, having a plurality of openings 342 similar to the openings 314 of the extrusion plate 312, is attached to the bottom portion of the main body 30. When the cream solder 5 is pushed downward by the cylinder 16, the cream solder 5 moves downward through the openings 314 of the extrusion plate 312 and the openings 342 of the throttle plate 34. As a result, the extruded cream solder 5 reaches a space formed beneath the main body 30, that is, a print space 35 surrounded by a squeegee part 36 provided at the bottom surface of the main body 30 and the bottom surface of the main body 30. Since the pressurized cream solder 5 passes through a number of openings 312 and 342, viscosity of the cream solder 5 is reduced to facilitate the screen printing process.

Figure 4:
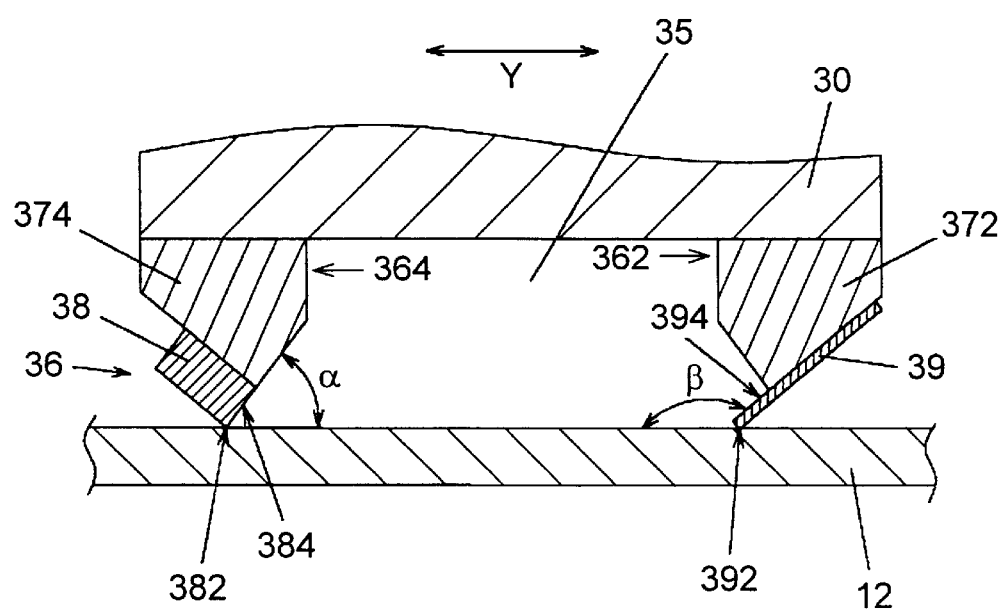
FIG. 4 is a partially sectional view of the squeegee head of the screen printing apparatus according to the exemplary embodiment of the present invention.

Referring to FIG. 4, the squeegee part 36 and the print space 35 will now be described. The squeegee part 36 consists of walls to form the print space 35 under the main body 30. Sliders 362 and 364 are provided at both ends of the squeegee part 36 in the squeegee direction (the direction shown by the arrow Y). The slider 362 comprises a block 372 and a wiper 39 fixed to the block 372. The slider 364 comprises a block 374 and a filling member 38 fixed to the block 374. During the screen printing operations, the pressurized cream solder 5 is stored in the print space 35 and makes a contact with the surface of the mask plate 12 between the filling member 38 and the wiper 39.

The filling member 38 is a block made of resin or elastomer having flexibility. The wiper 39 is a thin plate made of metal, such as stainless steel. The filling member 38 fixed to the block 374 and the wiper 39 fixed to the block 372 consist of a part of the wall forming the print space 35.

A lower end 382 of the filling member 38 slides on the mask plate maintaining an acute angle $\alpha$ with the surface of the mask plate 12 in the print space 35. A lower end 392 of the wiper 39 slides on the mask plate maintaining an obtuse angle $\beta$ with the surface of the mask plate 12 in the print space 35. An inside surface 384 of the filling member 38 forms a filling surface for filling the cream solder 5 into the pattern apertures 122. An inside surface 394 of the wiper 39 forms a wiping surface for wiping the extra cream solder 5 on the mask plate 12.

Figure 5A:
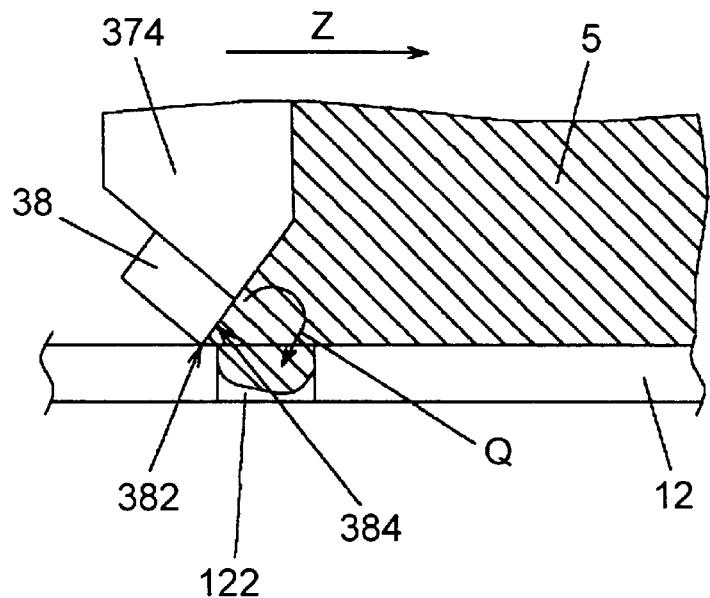
FIG. 5A is an illustration showing a function of a filling member of the squeegee head according to the exemplary embodiment of the present invention.
Figure 5B:
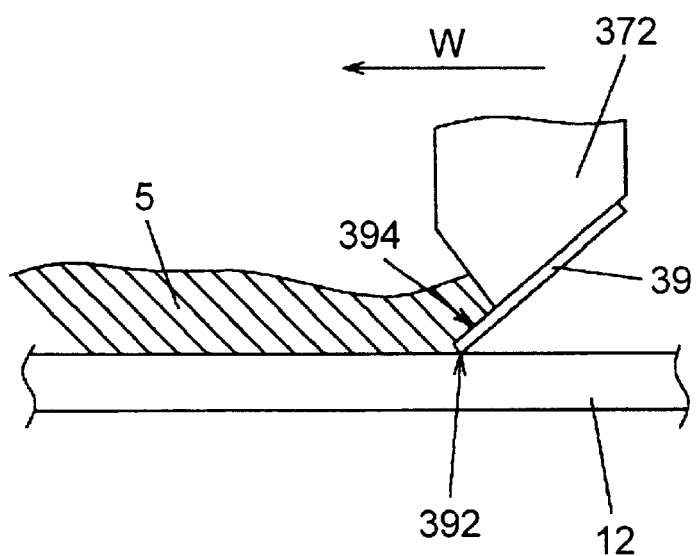
FIG. 5B is an illustration showing a function of a wiper of the squeegee head according to the exemplary embodiment of the present invention.

As shown in FIG. 5A, the cream solder 5 is filled in the pattern apertures 122 by the filling member 38 when the squeegee head 13 is moved in the direction shown by the arrow Z. As shown in FIG. 5B, the extra cream solder 5 is wiped away from the upper surface of the mask plate 12 by the wiper 39 when the squeegee head 13 is moved in the direction shown by the arrow W. Accordingly, the filling and the wiping of the cream solder 5 are executed by one reciprocation (a round-trip motion) of the squeegee head 13.

Referring to FIG. 5A, when the squeegee head 13 moves in the direction represented by the arrow Z under the condition that the pressurized cream solder 5 is filled in the print space 35, a part of the cream solder 5 at the periphery of the filling member 38 receives a rolling force Q from the filling surface 384. As a result, the cream solder 5 is satisfactorily filled in the pattern apertures 122 of the mask plate 12. Preferably, the acute angle a is within a range between 50° and 80° to achieve good results.

Referring to FIG. 5B, when the squeegee head 13 moves in the reverse direction represented by the arrow W, the lower end 392 of the wiper 39 wipes away the extra cream solder 5 on the upper surface of the mask plate 12 and the wiping surface 394 wipes it away from the mask plate 12. Since the wiper 39 has a thin shape which is ideal for wiping and has the contact angle $\beta$ with the surface of the mask plate 12, no extra cream solder 5 remains on the surface of the mask plate 12 after the squeegee head 13 passes to wipe the extra cream solder 5. Preferably, the obtuse angle $\beta$ is within a range between 100° and 180° to achieve good results.

A part of the mask plate 12 which is not supported by the substrate 3 (hereinafter referred to as "non-supported area") is liable to sag. Accordingly, extra cream solder 5 may remain on the surface of the mask plate 12 since a gap may be created between the squeegee head 13 and the mask plate 12. Even in this case, the wiper 39 follows the surface of the mask plate 12 to prevent the cream solder 5 from remaining on the surface of the mask plate 12 according to the embodiment of the present invention.

Push-in operations of the cream solder 5 for the screen printing utilizing the closed-type squeegee head 13 will now be described. The cream solder 5 is filled in the pattern apertures 122 of the mask plate 12 not only by the rolling of the cream solder 5 caused by the movement of the squeegee head 13 but also by push-in action of the cream solder 5 caused by pressurizing the cream solder 5 in the squeegee head 13.

Pressure to be applied to the cream solder 5 by the cylinder 16 as a paste presser may be increased in order to increase the push-in action of the cream solder 5. The cream solder 5, however, generally has a characteristic that it looses its fluidity and is hardened when a certain pressure is applied. This hardening phenomenon is facilitated the longer the high pressure is applied to the cream solder 5. Accordingly, when the screen printing operation is repeated in order to process a number of substrates, the cream solder 5 within the squeegee head 13 gradually looses its fluidity, and the paste filling characteristic in the pattern apertures 122 is reduced.

Figures 6A, 6B:
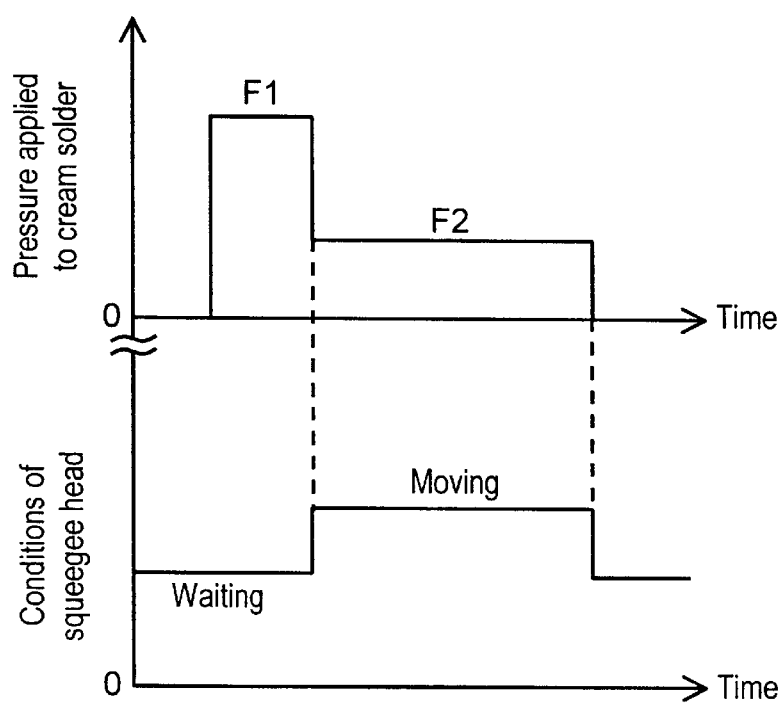
FIGS. 6A and 6B are timing charts showing a relation between pressure applied to a solder paste and conditions of the squeegee head according to the exemplary embodiment of the present invention.

In order to prevent such reduction in the paste filling characteristic, the cream solder 5 is pressurized based on the pressure scheme shown in FIG. 6A according to the embodiment of the present invention. The pressure scheme in FIG. 6A shows a change of pressure applied to cream solder 5 (pressure applied by the cylinder 16) during the printing operation for a substrate 3.

In a waiting position where the squeegee head 13 is on standby at the non-supported area on the mask plate 12, the cream solder 5 is pressed by the cylinder 16 via the pressurization plate 32 with pressure F1. Accordingly, the cream solder 5 in the cartridge 31 is pushed to the print space 35 within the squeegee head 13 to complete the preparation for the printing.

Following the above preparation step, the printing operation starts. When the squeegee head 13 moves in a supported area where the substrate 3 supports under the mask plate 12, the pressure to be applied to the cream solder 5 by the cylinder 16 is reduced from the pressure F1 to pressure F2.

The pressure F2 is maintained as low as possible, while still allowing the cream solder 5 to be properly filled in the pattern apertures 122. F2 may be zero if the cream solder 5 is filled in the pattern apertures 122 satisfactorily, since the inertial force, which presses the cream solder 5, is generated during the above preparation step. According to the pressure control method described above, the cream solder 5 is well filled in the pattern apertures 122 without adding excessive pressure to the cream solder 5 within the squeegee head 13.

According to the embodiment of the present invention, the pressure applied to the cream solder 5 is variable such that the higher pressure is applied only during the preparatory operation in which an ample amount of the cream solder 5 is pushed into the print space 35 and the lower pressure is applied during the printing operation in which the rolling force is applied to the cream solder 5.

Thus, the hardening phenomenon caused by maintaining pressure on the cream solder 5 is minimized, and a defective printing caused by the hardening of the cream solder 5 is reduced.

The preparatory operation in order to push the cream solder 5 into the print space 35 may be carried out per each substrate. Alternatively, it may be carried out every predetermined number of substrates.

Although the present invention has been described in connection with the preferred embodiments thereof with reference to the accompanying drawings, it is to be noted that various changes and modifications will be apparent to those skilled in the art. Such changes and modifications are to be understood as being included within the scope of the present invention as defined in the appended claims.

What is claimed is:

1. A method of screen printing for printing a paste onto a substrate via a pattern aperture formed in a mask plate by sliding a squeegee head on the mask plate, said squeegee head having a member defining a space for accommodating the paste, said method comprising the steps of:

filling the paste into the pattern aperture by sliding a filling member provided at a first lower end of said squeegee head, said filling member forming an acute angle with an upper surface of the mask plate within said space; and removing extra paste from the upper surface of the mask plate by sliding a wiper provided at a second lower end of said squeegee head, said wiper forming an obtuse angle with the upper surface of the mask plate within said space.

2. The method of screen printing of claim 1, wherein;

said filling step includes sliding said filling member along said mask plate in a first direction; and said removing step includes sliding said wiper along said mask plate in a second direction opposite to said first direction.

3. The method of screen printing of claim 1, wherein said method includes pushing said squeegee head against the mask plate such that said filling member and said wiper maintain contact with the upper surface of the mask plate.

4. The method of screen printing of claim 1, wherein;

said acute angle formed between said filling member and the upper surface of the mask plate within said space is in a range between 50° and 80°; and said obtuse angle formed between said wiper and the upper surface of the mask plate within said space is in a range between 100° and 180°.

5. The method of screen printing of claim 3, wherein;

said acute angle formed between said filling member and the upper surface of the mask plate within the space is in a range between 50° and 80°; and said obtuse angle formed between said wiper and the upper surface of the mask plate within the space is in a range between 100° and 180°.

6. The method of screen printing of claim 1, wherein;

said method further includes a step of pressurizing the paste accommodated in said squeegee head before driving said squeegee head for printing the paste.

7. The method of screen printing of claim 1, wherein said method further includes the steps of;

applying a first pressure to the paste accommodated in said squeegee head when said squeegee head is in a waiting position; and applying a second pressure smaller than said first pressure to the paste accommodated in said squeegee head while said squeegee head is moving on the mask plate.

8. The method of screen printing of claim 5, wherein said method further includes the steps of;

applying a first pressure to the paste accommodated in said squeegee head when said squeegee head is in a waiting position; and applying a second pressure smaller than said first pressure to the paste accommodated in said squeegee head while said squeegee head is moving on the mask plate.

9. A method of screen printing for printing a paste onto a substrate via a pattern aperture formed in a mask plate by sliding a squeegee head on the mask plate, said squeegee head having a member defining a space for accommodating the paste, said method comprising the steps of:

applying a first pressure to the paste accommodated in said space when said squeegee head is in a waiting position; and applying a second pressure smaller than said first pressure to the paste accommodated in said space while said squeegee head is sliding on the mask plate for printing.

10. The method of screen printing of claim 9, wherein said method further comprises the steps of:

filling the paste into the pattern aperture by sliding a filling member provided at a first lower end of said squeegee head along said mask plate, while maintaining said second pressure to the paste, said filling member forming an acute angle with an upper surface of the mask plate within said space; and removing extra paste on the upper surface of the mask plate by sliding a wiper provided at a second lower end of said squeegee head along said mask plate, while maintaining said second pressure to the paste, said wiper forming an obtuse angle with the upper surface of the mask plate within said space.

11. The method of screen printing of claim 10, wherein;

said acute angle formed between said filling member and the upper surface of the mask plate within said space is in a range between 50° and 80°; and said obtuse angle formed between said wiper and the upper surface of the mask plate within said space is in a range between 100° and 180°.

* * * * *